Figure 1:
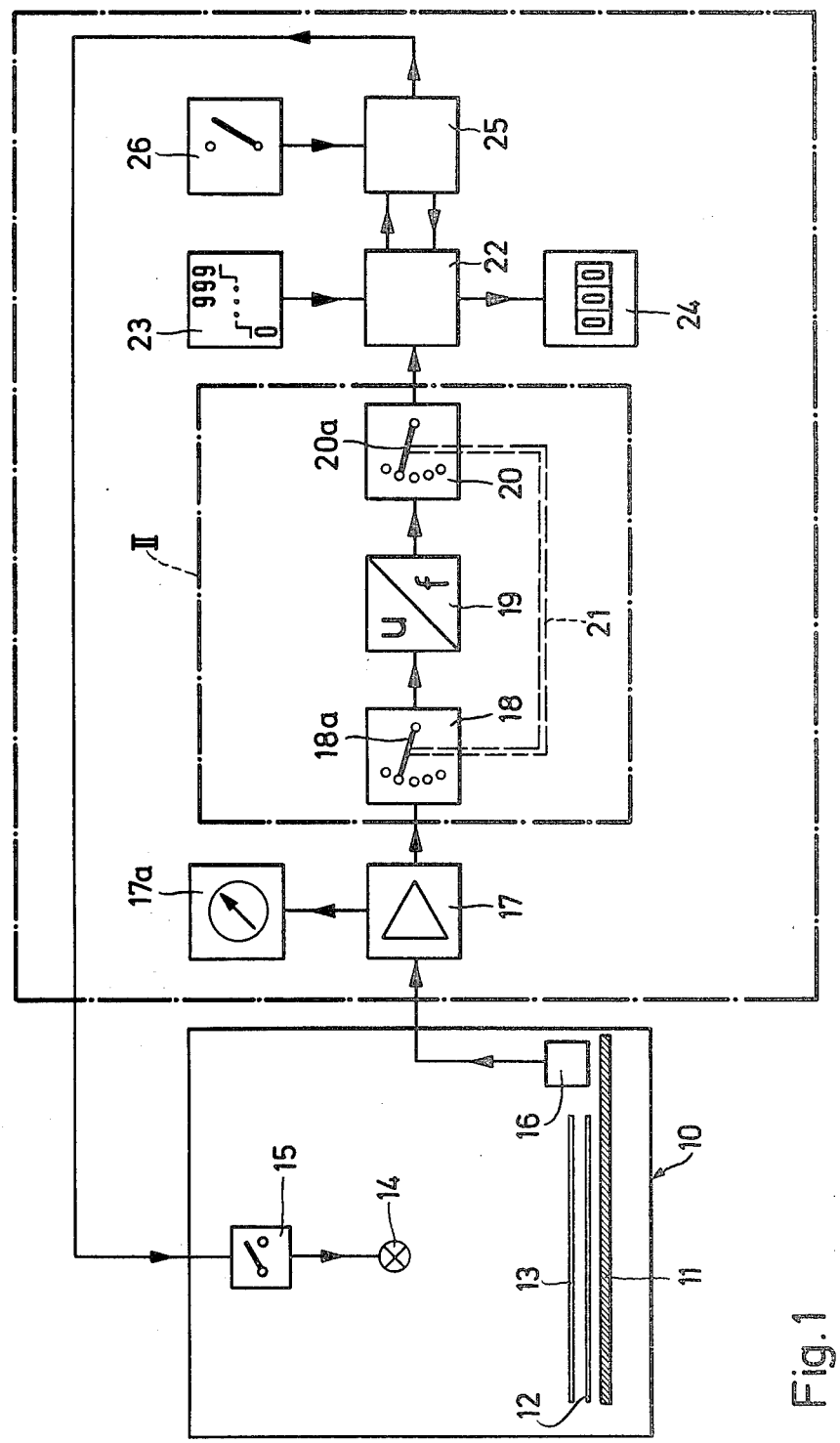

United States Patent [19]

Sader et al.

[11] 4,143,968

[45] Mar. 13, 1979

[54] CONTROL DEVICE AND COPIER

[75] Inventors: Georg Sader, Bechtheim; Walter Pils, Bremthal, both of Fed. Rep. of Germany

[73] Assignee: Hoechst Aktiengesellschaft, Fed. Rep. of Germany

[21] Appl. No.: 699,086

[22] Filed: Jun. 23, 1976

[30] Foreign Application Priority Data

Jun. 27, 1975 [DE] Fed. Rep. of Germany ..... 25286593

[51] Int. Cl.$^2$ ............................................. G03B 27/78
[52] U.S. Cl. ......................................... 355/83; 355/68
[58] Field of Search ............................ 355/83, 68–70, 355/35, 38; 250/206, 214 P

[56] References Cited

U.S. PATENT DOCUMENTS

| | | | |
|---|---|---|---|
| 3,790,789 | 2/1974 | Takahashi et al. | ............... 355/68 X |
| 3,795,444 | 3/1974 | Glidden et al. | ................... 355/68 |

*Primary Examiner*—L. T. Hix
*Assistant Examiner*—W. J. Brady
*Attorney, Agent, or Firm*—James E. Bryan

[57] ABSTRACT

This invention relates to a control device, suitable for use to control the exposure of a light-sensitive material in a copying apparatus for the preparation of a printing plate, which comprises program store means for predetermining a basic exposure, input line means for connection to a photocell for measuring the luminous intensity of a light source in the copying apparatus, comparator means having its input connected to an output of the program store means and connected by a transmission path means to the input line means, the output of the comparator means being connectable to a control switch for the light source, and the transmission characteristics of the path being variable in steps, adjacent pairs of which have transmissivities in the ratio $\sqrt{2}:1$.

7 Claims, 3 Drawing Figures

CONTROL DEVICE AND COPIER

This invention relates to a control device, especially a device for controlling the exposure of light-sensitive materials.

The invention provides a device for controlling the amount of light for exposing light-sensitive material in copying apparatus for the preparation of printing blocks, which material is exposed to a light source (copying lamp) through a copy original, the device having at least one program store, which is adjustable in particular in uniform gradation in accordance with the amount of light, for predetermining a basic exposure time which may be varied to take into account the luminous intensity value, with an electric photoreceiver or photocell measuring the luminous intensity value and with an integrating comparator which, for the comparison of a value stored in the program store with the integrated luminous intensity value, is connected on the one hand to the program store and on the other hand to the photoreceiver, and the output of this integrating comparator is connected to a regulating unit or on-off switch for the light source.

An arrangement of this type has been proposed in an exposure control apparatus and comprises a program store with four channels. In each channel a desired exposure time can be set manually by a digital transmitter. To take into account the brightness of the copying lamp, varying, for example, in accordance with main voltage, an electric photoreceiver is provided which is directed at the copying lamp and measures a portion of the light flux leaving the lamp as a luminous intensity value. The electric output signal of the photoreceiver is converted into a corresponding pulse frequency and supplied to a counter preset with the digital transmitter until this counter reaches zero. The counter therefore serves to compare the digital reference value that has been read in with the integrated actual value of the luminous intensity. The times set with the transmitters and the termination of the exposure time are indicated on setting elements or on a digital scale.

In such an exposure control apparatus various exposure times can be set and stored for example, for different types of plates or for exposure times differentiated for proof copies or for continuous printing runs in the case of the same types of plates. Differentiated exposure times for proofs and separate prints are desirable in many cases since in production printing machines an increase in the tone value occurs in comparison with the printed image produced with a flat bed proof press. This increase in tone value can be substantially compensated by controlled prolongation of exposure.

In order to assess the alterations of exposure on the printing plate necessary for this or for other purposes, a transparent-grey scale according to DIN 16,545 is normally copied as well. The effect of the exposure time is assessed by means of this gray scale depending upon the last step of the grey scale still remaining fully covered on the plate, variations in exposure being assessed from step to step of the grey scale.

The alteration to a basic exposure time necessary for particular grey scale steps which are to be covered have previously been determined empirically. The required alterations of the basic exposure time were estimated or calculated by the operating personnel and introduced into one of the e.g., four channels of the program store which can be selectively introduced into the circuit.

The program store may be so constructed that an exposure time selected from any of 999 uniform steps may be fed into each channel, so that in particular the sensitivity of the prinrting plate to be exposed can be accurately taken into account. To each step there corresponds in the transmitter one pulse of the pulse sequence, which is produced with a frequency depending upon the brightness of the copying lamp.

A disadvantage in these exposure control apparatuses is that necessary changes of the basic exposure time, when they are to be carried out in a controlled manner, must first of all be determined by operating personnel, and the changes are generally carried out in accordance with experimental values or by time consuming and expensive preliminary tests. Calculation of any exposure time that is different from the basic exposure time, is, if it has to be done by operating personnel, both time consuming and susceptible to error. These disadvantages of the calculation occur in particular when the exposure must be altered in accordance with a grey wedge step, which corresponds to a calculating operation with the value $\sqrt{2}$. The transmission of the result of the calculation into the transmitter of the program store introduces a further possibility of error. In addition to this, the calculated values cannot be easily reproduced quickly and reliably.

It would be desirable to provide a circuit arrangement suitable, inter alia, for controlling the exposure time of light-sensitive material in copying apparatus for the production of printing forms, avoiding the above-mentioned disadvantages, and in which the exposure time can be adapted quickly and reliably to the particular conditions involved without changing the basic setting of the program store, which conditions, may, for example, reside in the different intended use of the printing plates produced or in the exposure of colored films associated with different colors. Time consuming and error causing calculations by the operating personnel should be avoided, and it should be possible to vary the basic exposure time quickly, clearly and in an easily reproducible manner, with minimum expenditure.

The present invention provides a control device suitable for use, for example, with apparatus for making printing forms from light-sensitive materials by exposure to a light source, in which control system there is provided a transmission path for a signal having a property dependent upon the strength of the light source to a control device for the duration of exposure, the transmission behavior of the signal transmission path being variable in a series of steps; preferably the steps are such that, for a given originating signal, adjacent steps vary the signal to the control device by ratios of $\sqrt{2}$.

The invention also provides a copying apparatus having the control device of the invention, whereby the exposure of an original and a light-sensitive material may be step-wise varied, adjacent steps giving exposures in a ratio of $\sqrt{2}:1$.

Independently of the setting of the program store, the apparatus allows a change of the set exposure time in a simple predetermined way by a variable transmission member arranged between the photoreceiver and the comparator. By this means the exposure time can be varied beginning from any set basic exposure time in accordance with steps predetermined initially and thus quickly adjustable and reproducible. Time consuming preliminary tests which involve expenditure and complicated calculations causing errors are avoidable.

When a multivalue digital program store is used, the transmission member variable in predetermined steps is advantageously arranged between the photoreceiver and the comparator.

If the program store does not have have several digital positions, the arrangement of the type initially mentioned is alternatively formed in accordance with the invention also in the manner that, to change the basic exposure time by one of several predetermined factors, at least one transmission member is arranged in the transmission path between the program store and the comparator, the transmission behavior of which member is variable in predetermined steps. The circuit arrangement is especially advantageous when the program transmitter delivers a signal of magnitude depending on the desired basic exposure time, in particular a voltage of adjustable level.

It is particularly advantageous in the arrangements of the two aforementioned constructional variations if the variable transmission member is such that the change in the amount of light for each step corresponds to the adjacent stage of a grey scale (according to DIN 16,545).

As a result the set basic exposure time can be varied quickly, simply and without error and a previously determined effect can be consistently achieved. In order to lengthen or shorten the exposure time by one grey scale step respectively, the "basic" exposure time does not have to be altered. If, for example, the basic exposure time is adjusted to step 5 of a 20-step grey scale (according to DIN 16,545) with the appropriate grey scale step covered by turning a switch to one particular position, by turning the switch in a given direction from the basic position, the grey scale step 4 appears covered.

It has proved adequate, and in view of the cost of the arrangement particularly advantageous, to design the variable transmission member with four steps for lengthening the exposure time and four steps for shortening the exposure time, from a basic central position.

Preferably, the transmission member, which can be changed over, is designed so that the transmission characteristic can be changed over in the steps $4^{-1}$; $(2\sqrt{2})^{-1}$; $2^{-1}$; $\sqrt{2}^{-1}$; 1; $\sqrt{2}$; 2; $2\sqrt{2}$; 4.

With these ratios, another grey scale step is covered for each step of the variable transmission member.

For an arrangement which is provided with a digital program store, the arrangement is advantageously so designed that a voltage frequency converter is arranged in the transmission path between the photoreceiver and the comparator, and that an adjustable frequency divider is arranged after the voltage frequency converter in the direction of flow of the signal. With the adjustable frequency divider, the desired transmission behavior can be achieved very accurately with relatively low expenditure. The frequency divider, advantageously, comprises one chain of trigger stages connected in series. The input of the first trigger stage of the series is fed with a pulse sequence from the voltage frequency converter. The trigger stage is basically a frequency halver, i.e. a reduction of the pulse frequency by a factor of 2 occurs between the input and output of this trigger stage. The output from each trigger stage, except the last, is connected to the input of the next, and each output is also connected to a pole of a multiposition switch. The basic exposure time is set when the switch is switched to the output of a particular trigger stage which in the direction of flow of the signal in the series of trigger stages itself follows a number of trigger stages, and to which, in turn, a number of trigger stages are connected. If the switch is switched to a trigger stage lying before the determined trigger stage in the direction of flow of the signal, then there is a multiplication of the pulse frequency, which corresponds to a shortening of the exposure time. Conversely, when the changeover switch is switched to one of the trigger stages after the determined trigger stage in the direction of flow of the signal, a reduction of the pulse repetition frequency occurs and similarly there is a prolongation of the exposure time. With this arrangement alternate steps of a 20-step grey scale could be achieved simply and reliably.

Change of the exposure time to any grey scale step lying between those provided by the above system, by which the exposure time may be varied at a ratio of $\sqrt{2}$, is advantageously achieved in another manner:

For this purpose there is arranged in the direction of flow of the signal before the voltage frequency converter, a variable voltage divider, with which, for example, three positions are provided having a series of ratios of $\sqrt{2}$; 1; or $\sqrt{2}^{-1}$.

The multiplication of the signal delivered by the photo-receiver by a factor which is not a whole number or by a factor which is not a fraction of a whole number is thus achieved with particularly low expenditure by altering the voltage but not by altering the pulse frequency corresponding to it. Here a voltage which has not been reduce can correspond to the factor $\sqrt{2}$, a correspondingly lower value to the factor 1 and a lower value again to the factor $\sqrt{2}^{-1}$.

To monitor the precise method of operation of the arrangement under different conditions, advantageously the apparatus is provided with a voltage indicator in the circuit before the voltage divider in the direction of flow of the signal.

Independently of the change-over position of the transmission member which can be changed-over, it is possible to determine whether following the voltage indicator in the direction of flow of the signal all switching groups and switching elements are operating in the linear transmission range.

Figure 2:
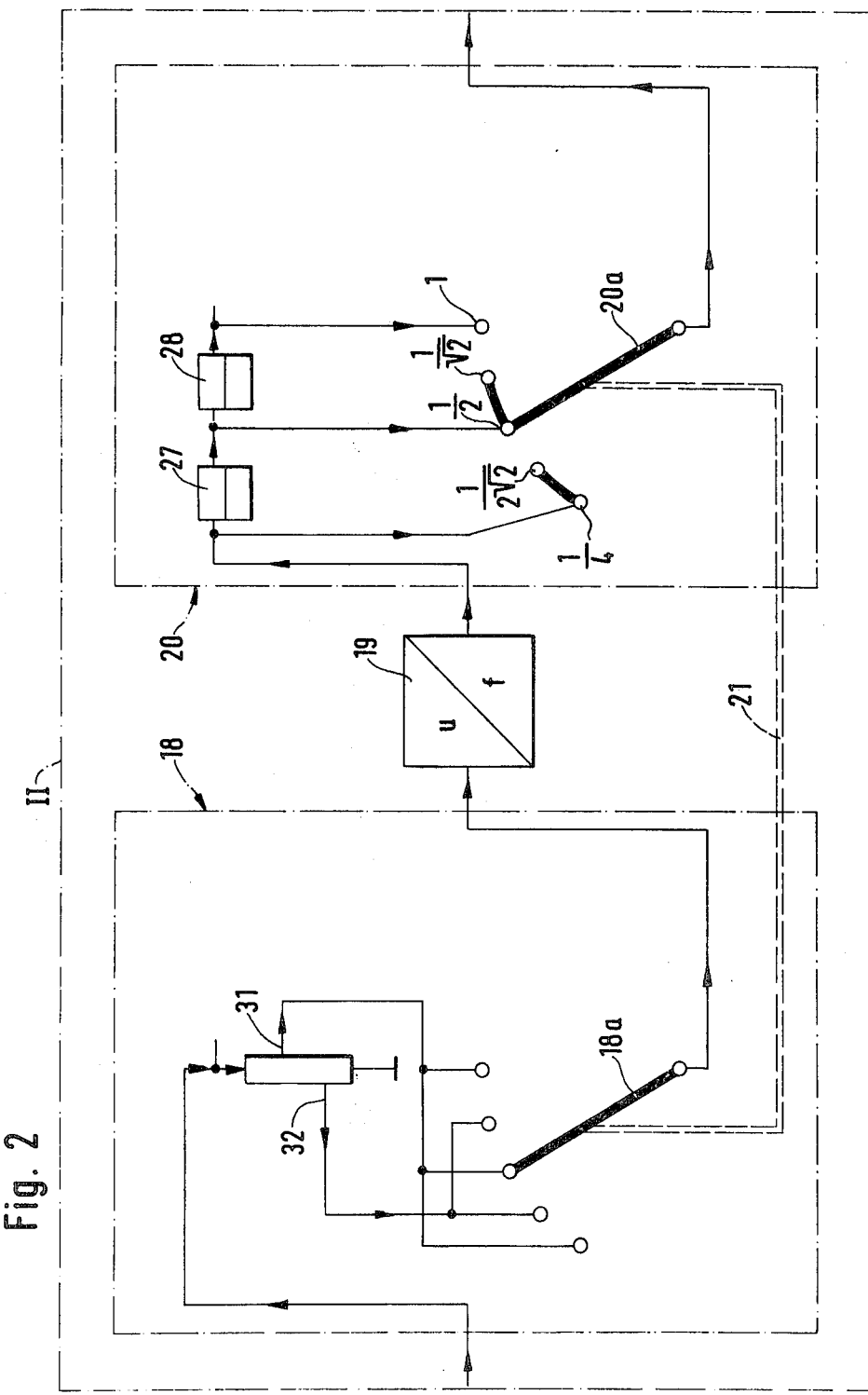
Figure 3:
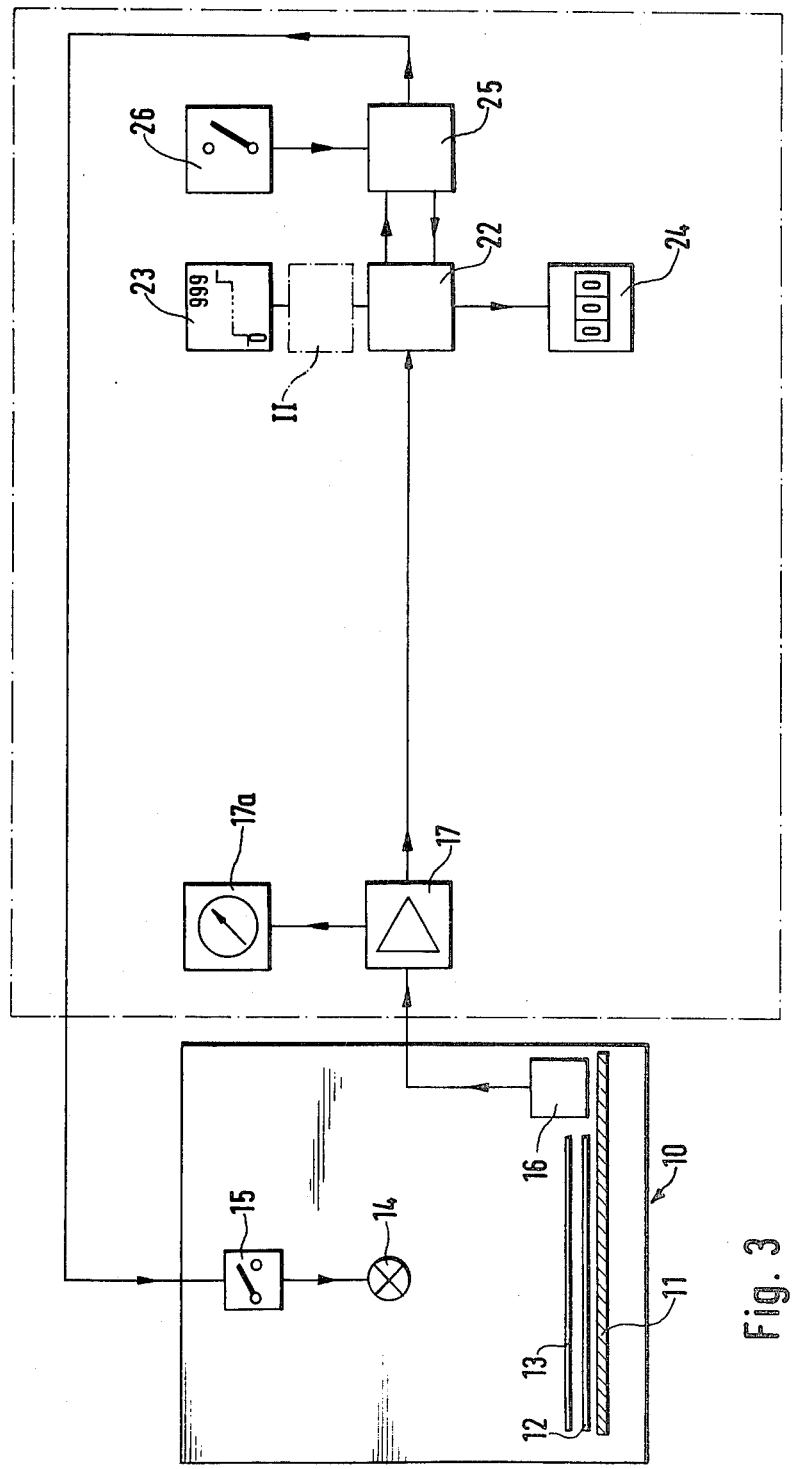

Two forms of apparatus constructed in accordance with the invention will now be described by way of example, with reference to the accompanying drawings, in which FIG. 1 shows a first form of the apparatus in the form of a schematic block diagram, FIG. 2 shows the variable voltage divider and the variable frequency converter which form an important part of the apparatus, also in a schematic circuit diagram, and FIG. 3 shows a second form of the apparatus in the form of a schematic block diagram.

In FIG. 1, in addition to the block diagram of the control apparatus, a copying apparatus 10, in which the exposure is to be controlled, is also shown schematically. The copying apparatus comprises a copying frame 11, on which light-sensitive material 12, for example a printing plate, and a transparent original 13 are arranged. A copying lamp 14 is used to illuminate the light-sensitive material through the copy original. The copying lamp 14 is in electrical contact with a regulating unit 15. The luminous intensity produced by the copying lamp 14 in the exposure plane is measured by an electric photoreceiver (photocell) 16. These parts belong to the copying apparatus. The electric elements and structural groups described below are part of a control apparatus, and may be arranged in a housing which is spatially separate from the copying apparatus.

The control arrangement is in electrical contact with the photocell 16 and with the regulating unit (switch) 15. The output of the photocell 16 is connected to an amplifier 17. The amplified output voltage may be measured by a voltage indicator 17a. After the amplifier 17 in the direction of flow of the signal are a variable voltage divider 18, a voltage frequency converter (e.g. a voltage-controlled oscillator) 19 and a variable frequency reducer 20. Control elements 18a and 20a of the voltage divider and of the frequency divider are, as indicated by a broken line 21, ganged and are adjustable by a single control knob, not shown in the drawing. The constructions of the voltage divider 18 and the frequency divider 20 are described in greater detail below with reference to FIG. 2.

The output of the adjustable frequency reducer 20, which is a signal composed of a series of pulses, is connected to an integrating comparator which is basically a pulse counter. The counter can be preset by way of a program store having a numerical setting member 23. With the latter the counter can be set to values between 0 and 999 pulses. When the output of the frequency divider 20, i.e., pulses corresponding to the luminous intensity measured by the photoreceiver 16 and in accordance with the switch positions of elements 18a and 20a, reaches the counter 22, it is reset by one step for each pulse, until it reaches the value 0. The value reached in the counter is shown by a digital indicator 24. When the zero value is reached, an appropriate signal passes to the control device 25, positioned downstream in the direction of flow of the signal, which is an order to the switch 15 to switch off the copying lamp.

Also connected to the control device is a starting means 26 which is actuated when an exposure operation is to begin. In this case the switch 15 is closed so that the copying lamp 14 lights up. A portion of the light flux issuing from the copying lamp 14 is received by the photoreceiver 16 which delivers an electrical signal, corresponding to the luminous intensity, to the amplifier 17. This signal is indicated by the voltage indicator 17a. By this means the operating personnel can check whether the luminous intensity lies within those limits which are to be observed for the operation of the circuit arrangement in a desired characteristic curve range.

Referring now more especially to FIG. 2, the output from the amplifier passes into the variable voltage divider 18, and from there, possibly attenuated according to the position of the switch elements 18a, into a voltage frequency converter which produces a pulse at a frequency corresponding to the voltage. The output of the voltage frequency converter 19 is connected to the variable frequency divider 20 which comprises two trigger stages 27 and 28 and a switch element 20a. The switch element 20a has five schematically illustrated contacts beside which the variation factors from the basic exposure time are indicated on FIG. 2. The pulses fed into the variable frequency divider pass into the input of the first trigger stage 27. Each of the trigger stages 27 and 28, is a frequency halver and hence the signal output from each is one pulse for every two input pulses. Accordingly there is a reduction by a factor of 2 at each of the trigger stages 27 and 28. The entire circuit arrangement is so designed that the basic exposure time is associated with a pulse frequency which appears at the output of the trigger stage 28, since a numerical unit of the number introduced with the numerical setting member 23 corresponds to each pulse at the output of the trigger stage 28. If the pulse frequency is taken at the output of the trigger stage 27 by the chosen position of the switching element 20a, the pulse frequency is twice as high as that at the output of the trigger state 28; this results in a halving of the basic exposure time. The pulse frequency at the input of the trigger stage 27 is four times as high as the pulse frequency at the output of the trigger stage 28. By setting the switching element 20a to the input of the trigger stage 27, a fourfold pulse frequency is therefore conveyed to the line coming off the change-over element 20a, which corresponds to a quarter of the basic exposure time.

With the adjustable frequency reducer 20 it is possible, therefore, with low expenditure, to produce very accurate pulse frequencies which are fractions with complete even-numbered denominators of a pulse frequency. For the steps lying inbetween, which are formed by the factor $\sqrt{2}$ or its reciprocal value, the variable voltage divider 18 is used. This voltage divider is so designed that at a middle tapping 31 the input voltage is reduced by the factor $\sqrt{2}^{-1}$. The voltage output from this tapping corresponds, according to the basic design of the apparatus, to a variation factor 1 of the basic exposure time, i.e. the normal basic exposure time. When voltage is taken at a lower tapping 32, the voltage is reduced by the value $\sqrt{2}^{-1}$ in comparison with the middle tapping 31. The result is an exposure time longer by the factor $\sqrt{2}$.

It may be seen from FIG. 2 that the change-over elements 18a and 20a are so coupled with one another that there is associated with the variation factors formed with even numbers the middle tapping 31 of the variable voltage divider, and associated with the variation factors formed with the factor $\sqrt{2}$ the lower tapping 32 at the variable voltage divider.

In the following, a table shows the connections which can be achieved with the arrangement between the positions of the ganged, switching elements 18a and 20a, and the variation factors achieved thereby, and an example of the resulting grey scale steps and the corresponding blackenings.

| change-over position | −4 | −3 | −2 | −1 | 0 |
|---|---|---|---|---|---|
| variation factors of the basic exposure time | $4^{-1}$ | $(2\sqrt{2})^{-1}$ | $2^{-1}$ | $\sqrt{2}^{-1}$ | |
| grey scale step | 5 | 6 | 7 | 8 | 9 |
| blackening | 0.75 | 0.9 | 1.05 | 1.2 | 1.35 |

With the described arrangement, exposure can be carried out, for example, in the following manner:

For a printing plate 12 which is to be exposed, it may be assumed that the manufacturer has indicated a basic exposure time of 100 units which are set with the numerical setting member 23 of the program store. If the basic exposure time is not altered, the grey scale step 9 would thus stand covered on the printing plate. With such a printing plate there are to be produced from an original a proof plate, which is to be used in a flat bed proof press, and a machine plate which is to be introduced into a production machine. It has been ascertained internally that the proof plates produce optimum results at step 6 and machine plates at step 9 covered. To obtain these results with the arrangement, the ganged switching elements 18a and 20a need for the proof plate merely to be set to the switch position -3, and for the machine plate to the switch position 0. Without altering the setting member 23 the copy result will turn out as desired for both intended purposes of the printing plates.

In FIG. 3, the control apparatus has the same features as the control apparatus in FIG. 1 with the following exceptions:

The counter 22 which represents an integrating comparator can be preset by way of the program store having the numerical setting member 23, via a transmission path comprising the box II. The box II comprises — as shown in FIGS. 1 and 2 within dot-dash lines — a variable voltage divider 18, a voltage frequency converter 19 and a variable frequency reducer 20. The design and the function of these components 18, 19, and 20 are described in greater detail in connection with FIG. 2. Accordingly, the counter 22 is preset to a value depending on the output of the setting member 23 and depending on the setting of the switching elements of the variable voltage divider and of the variable frequency reducer.

Further, the counter 22 representing the integrating comparator has an input connected to an input line following an amplifier 7. No transmission path means like the box II are arranged between the line and the counter 22 which comprises means for generating a pulse frequency depending on the voltage of the input line.

It will be obvious to those skilled in the art that many modifications may be made within the scope of the present invention without departing from the spirit thereof, and the invention includes all such modifications.

What is claimed is:

1. A control device, suitable for use to control the exposure of a light-sensitive material in a copying apparatus for the preparation of a printing plate, which comprises program store means for predetermining a basic exposure, input line means for connection to a photocell for measuring the luminous intensity of a light source in the copying apparatus, comparator means having its input connected to an output of the program store means and connected by a transmission path means to the input line means, the output of the comparator means being connectable to a control switch for the light source controlling the exposure of the light-sensitive material imagewise exposed by the light source, and the transmission characteristics of the path being variable in steps by switching means provided in the transmission path means, adjacent steps of which switching means have transmissivities in the ratio $\sqrt{2}:1$.

2. A device as claimed in claim 1 wherein the transmission path means is variable in five steps, giving values of 1, $\sqrt{2}^{-1}$, $2^{-1}$, $(2\sqrt{2})^{-1}$, and $4^{-1}$.

3. A device as claimed in claim 1 wherein the program store means has an output variable in linear uniform steps.

4. A control device as claimed in claim 1 wherein the transmission path comprises, in the direction followed by the signal from the input line, a variable voltage divider, having switching positions giving outputs in the ratios 1:1, and $\sqrt{2}^{-1}:1$, a voltage/frequency converter, and a variable frequency divider having switching positions giving frequencies in the ratios 4:1, 2:1 and 1:1.

5. A control device as claimed in claim 4 including coupled switching means for the voltage divider and the frequency divider.

6. A control device, suitable for use to control the exposure of a light-sensitive material in a copying apparatus for the preparation of a printing plate, which comprises program store means for predetermining a basic exposure, input line means for connection to a photocell for measuring the luminous intensity of a light source in the copying apparatus, comparator means having its input connected to an output of the program store means by a transmission path means and connected to the input line, the output of the comparator means being connectable to a control switch for the light source controlling the exposure of the light-sensitive material imagewise exposed by the light source, and the transmission characteristics of the path being variable in steps by switching means provided in the transmission path means adjacent steps of which have transmissivities in the ratio $\sqrt{2}:1$.

7. A device as claimed in claim 6 wherein the transmission path means is variable in five steps, giving values of 1, $\sqrt{2}^{-1}$ $2^{-1}(2\sqrt{2})^{-1}$ and $4^{-1}$.

* * * * *